United States Patent [19]

Asano et al.

[11] 4,373,004

[45] Feb. 8, 1983

[54] LASER BEAM-RECORDING MEDIA AND METHOD FOR MANUFACTURING THE SAME

[75] Inventors: Yoshihiro Asano; Akira Morinaka; Kei Murase, all of Mito, Japan

[73] Assignee: Nippon Telegraph & Telephone Public Corporation, Tokyo, Japan

[21] Appl. No.: 173,733

[22] Filed: Jul. 30, 1980

[30] Foreign Application Priority Data

Aug. 14, 1979 [JP] Japan .................................. 54-103269
Oct. 29, 1979 [JP] Japan .................................. 54-138761

[51] Int. Cl.³ .................... B32B 15/02; B32B 17/10; G01D 15/10; B05D 3/06
[52] U.S. Cl. ................................ 428/328; 346/76 L; 427/41; 427/39; 428/411; 428/433; 428/426; 428/441; 428/442; 428/447; 428/450; 428/461; 428/463; 428/520; 428/522; 428/913; 428/429; 430/945
[58] Field of Search .............. 427/41, 39; 346/76 L, 346/135.1; 428/328, 411, 433, 520, 522, 447, 450, 461, 463, 516, 429, 913, 441, 443, 426; 350/3.61; 430/2, 281, 945

[56] References Cited

U.S. PATENT DOCUMENTS

| | | | |
|---|---|---|---|
| 3,297,465 | 1/1967 | Connell | 427/39 |
| 3,990,084 | 11/1976 | Hamisch | 346/76 L |
| 4,069,487 | 1/1978 | Kasai | 346/76 L |
| 4,188,214 | 2/1980 | Kido | 346/76 L |
| 4,226,896 | 10/1980 | Coburn | 427/41 |
| 4,241,156 | 12/1980 | Haas | 430/945 |
| 4,269,917 | 5/1981 | Drexler | 430/945 |

*Primary Examiner*—Ellis P. Robinson
*Attorney, Agent, or Firm*—Frishauf, Holtz, Goodman & Woodward

[57] ABSTRACT

A recording medium suitable for a laser thermal recording is characterized in that a plasma polymerized film of carbon disulfide or an organic monomer containing a metal is used as the recording medium.

A method for manufacturing a laser beam-recording medium of this type is characterized by producing an electric discharge in a CS₂ or an organic monomer gas while evaporating a metal such as Te so as to form a plasma polymerized film containing the evaporated metal on a predetermined substrate.

10 Claims, 8 Drawing Figures

LASER BEAM-RECORDING MEDIA AND METHOD FOR MANUFACTURING THE SAME

The present invention relates to a laser beam-recording medium suitable for laser beam-recording via the thermal processes and a method for manufacturing the same.

A laser thermal recording is advantageous in many respects in that real time recording and instantaneous readout are possible without processing, supplementary recording of additional information is possible, archival storage is possible, and handling is easy since the recording medium can be handled under room light.

For this type of a laser beam-recording medium, it is known to use a thin metal film of Rh, Bi, Te or the like, a thin chalcogenide glass film consisting of Se, Te or the like, or a thin pigment film of fluorescein or the like. The optical storage systems and recording media are reviewed by R. A. Bartolini, A. E. Bell, R. E. Flory, M. Lurie and F. W. Spong, in "optical disk systems emerge", IEEE spectrum, vol.15, No.8, pp.20-28, (1978). However, the exposure sensitivity is low with these types of recording media. Therefore, the combination with various pieces of equipment such as a high-power recording laser, a modulator, a deflector and so on is required in order to accomplish recording in real time. Consequently, a recorder becomes bulky and expensive.

It has also been proposed to use a semiconductor laser as a light source for an optical storage system so as to make it compact and reliable at less cost. However, since the power of a semiconductor laser is as low as 15-20 mW and the emission wavelength is about 800 nm, the exposure sensitivity is low and real time recording is difficult with the above-mentioned conventional recording media. Thus, it has been desired to develop a highly sensitive recording medium which is capable of recording utilizing a semiconductor laser.

The primary object of the present invention is therefore to provide a highly sensitive laser beam-recording medium which is capable of utilizing a semiconductor laser as a light source for recording and readout, and a method for manufacturing the same.

To the above and other ends, the present invention provides, in one aspect, a laser beam-recording medium which comprises a substrate and a plasma polymerized film containing a metal or metals formed on this substrate.

In another aspect, the present invention provides a method for manufacturing a laser beam-recording medium which comprises effecting an electric discharge of $CS_2$ gas while evaporating a metal and forming a plasma polymerized film of $CS_2$-containing the evaporated metal on a predetermined substrate.

In still another aspect, the present invention provides a method for manufacturing a laser beam-recording medium which comprises effecting an electric discharge of a gas of an organic monomer while evaporating Te or a compound containing the element Te and depositing an organic plasma polymerized film containing Te on a predetermined substrate.

This invention can be more fully understood from the following detailed description when taken in conjunction with the accompanying drawing, in which.

A laser beam-recording medium in accordance with the present invention is capable of recording information by irradiating a laser beam modulated with information to be recorded and thus melting or evaporating the irradiated part or generating a change in the optical density or refractive index of this part.

A method for manufacturing a laser beam-recording medium in accordance with the present invention will now be described first.

According to the method for manufacturing a laser beam-recording medium of the present invention, an electric discharge in a gas containing at least $CS_2$ or an organic monomer is effected, metals or compounds of these metals are evaporated simultaneously and then a plasma polymerized film containing the evaporated metals is formed. The organic monomer used in the present invention may be at least one of the following: An aromatic compound such as styrene or chlorobenzene; a silane compound such as hexamethyl-disiloxane; a nitrile compound such as acetonitrile or acrylonitrile; and a cyclo-olefinic compound such as norbornadiene. The organic monomer and the $CS_2$ gas may be used independently or with an inert gas such as Ar or $N_2$.

For the evaporated metal, Te, Bi, Ag and In or their compounds may be used.

The gas pressure of the system for forming a plasma polymerized film is preferably on the order of $10$–$10^{-3}$ Torr. The gas pressure, in this case, means the pressure of the $CS_2$ gas and the organic monomer gas alone, or the sum of the total pressure of the $CS_2$ gas or the organic monomer gas with a pressure adjusting gas i.e. an inert gas such as Ar or $N_2$. When the pressure exceeds 10 Torr, it is difficult to form an organic plasma polymerized film and when it is below $10^{-3}$ Torr, it is difficult to obtain a stable glow discharge. The gas pressure is most preferably below 1 Torr so as to easily obtain fine metal powder with a particle size of below 100 Å.

An example of an apparatus for performing the method for manufacturing a laser beam-recording medium in accordance with the present invention will now be described.

Figure 1:
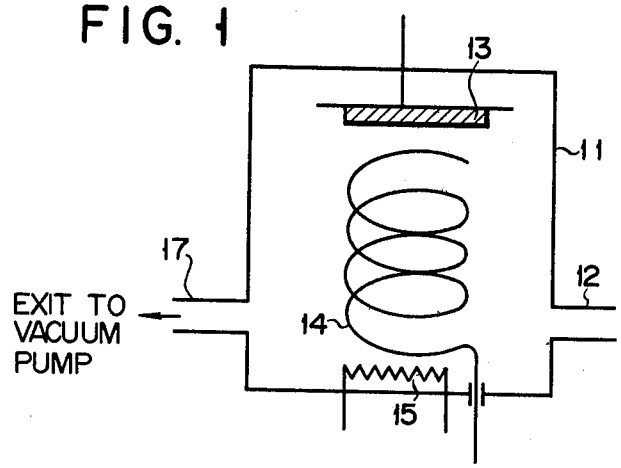
FIGS. 1 and 2 are symbolic representations illustrating an apparatus for manufacturing a laser beam-recording medium in accordance with the present invention.

FIG. 1 is a model view of an example of an apparatus for manufacturing a laser beam-recording medium according to the present invention wherein numeral 11 denotes a reaction chamber; 12, a gas inlet for $CS_2$, an organic monomer gas and so on; 13, a substrate; 14, a high frequency electrode; 15, a heater for evaporating a metal or its compound; and 17, an exit to vacuum system.

The reaction chamber 11 is first evacuated, and then $CS_2$ gas, an organic monomer gas or a mixture of these with an inert gas such as Ar or $N_2$ is charged through the gas inlet 12 into the reaction chamber 11 to a pressure on the order of $10$–$10^{-3}$ Torr. After charging the gas, a high frequency voltage of 13.56 MHz is applied to the high frequency electrode 14 for effecting an electric discharge. Simultaneously, a metal or its compound is evaporated by the evaporating heater 15 so as to form a plasma polymerized film containing a metal on the substrate 13.

Figure 2:
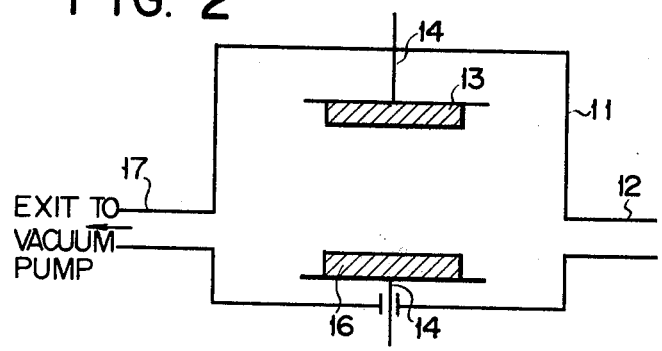

FIG. 2 shows another example of an apparatus for manufacturing the recording medium of the present invention wherein the numerals 11–15 denote the same parts as previously, and numeral 16 denotes a target consisting of a metal or its compound.

After the reaction chamber 11 is evacuated, an organic monomer gas or the like is charged through the gas inlet 12. Then, when a high frequency voltage is applied to the high frequency electrodes 14 to effect an electric discharge, $CS_2$ or the organic monomer are polymerized, and a metal or its compound of the target 16 is sputtered. A plasma polymerized film containing a metal or its compound is formed on the substrate 13.

In manufacturing, many other kinds of electric discharge may be adopted, such as an electric discharge effected by microwave or radio frequency wave, instead of one by the above frequency wave. Especially when parallel planar electrodes are used, a direct current electric discharge may be used. When the parallel electrodes are used, a metal or its compound to be included is used as a target for sputtering so as to form a polymerized film containing the metal.

Plasma polymerized films to be obtained by this invention have the following features. The polymerized layers prepared are considerably different in structure from polymers prepared by conventional polymerization methods and possess a highly cross-linked network structure, thereby providing a completely amorphous thin layer. For example, the infrared absorption spectra of an acrylonitrile plasma polymerized film show a decreased absorption based on —C≡N at 2,250 cm$^{-1}$, and absorption based on —C=NH at 3,500 cm$^{-1}$ and on —C=N— at 1,500 cm$^{-1}$. This means that the plasma polymerized acrylonitrile has a cross-linked network structure resulting from the cleavage of —C≡N. The plasma polymerized film is superior in chemical resistance, heat-resistance and mechanical characteristics to the polymers obtained by the conventional polymerization method due to this cross-linked network structure.

Accordingly, a plasma polymerized film generally can not be easily sublimated by heating. However, a plasma polymerized film to be produced from $CS_2$ gas has peculiar characteristics different from other plasma polymerized film.

The composition of the $CS_2$ plasma polymerized film is changed by varying the electric discharge power, the $CS_2$ gas pressure, the $CS_2$ gas flow rate and the substrate temperature, and ranges from $CS_{0.16}$ to $CS_{14}$. When the composition ranges from $CS_2$ to $CS_{14}$, a polymerized film sublimates at a temperature of 100°–220° C. with a 10% weight decrease.

The laser beam-recording sensitivity can be made higher by lowering the sublimation temperature of this $CS_2$ plasma polymerized film. Conversely, the durability of the film can be improved by raising the sublimation temperature. Consequently, the sublimation temperature is determined by varying the polymerizing conditions as described above in consideration of the required durability of the film and the recording sensitivity. In general, the sublimation temperature of this film is preferably 180°–200° C.

The optical absorption edge of a $CS_2$ plasma polymerized film is between visible region and near infrared region, and it varies according to its composition. At a wavelength of 800 nm, an absorption coefficient of as high as about $10^4$ cm$^{-1}$ is obtainable. Accordingly, when a visible laser beam is irradiated on the polymerized film, the absorbed light heats up the film and causes a pit to be formed due to localized vaporization.

This is still not sufficient to enable the use of a diode laser such as GaAs, since the emission wavelength of the laser is near infrared region (800–900 nm) and the absorption coefficient of the $CS_2$ plasma polymerized film is insufficient for that.

However, when metals such as Te, Bi, Ag or In, or alloys thereof such as PbTe, $Bi_2Te$, $Sb_2Te_3$, InSb, $In_2Te_3$, $Ag_2Te$ or $Ag_2S_3$ are added within a range of 10–90 volume % to such a film, this film has a sufficiently high absorption coefficient in the near infrared region. If the amount of metals is less than 10 volume %, the absorption coefficient in the near infrared region of the film would be insufficient for a laser beam-recording. On the other hand, if the amount of metals is more than 90 volume %, such a film will be almost identical with a metallic film in regards to thermal conductivity and thermal capacity so that only poor recording characteristics will be resulted.

With such a $CS_2$ plasma polymerized film containing metals, no optical inhomogeneity is noted since the particle size of the included metals is as small as less than about 100 Å. The surface of the film as observed by a scanning electronic microscope reveals smoothness. The absorption coefficient and refractive index of this film can be varied by changing the amount of the metal included in the polymerized film. For example, an absorption coefficient of $5 \times 10^4$ cm$^{-1}$ is easily obtained with a wavelength of 800 nm. Further, the sublimation temperature can be sufficiently lowered as compared with those of the included metals.

When Te and Bi are used for the included metals, the optical density and refractive index of the polymerized films are increased by heating. The X-ray diffraction measurements reveal that this is attributed to the inclusion of Te and Bi in the amorphous state which are crystallized by heating. That is, no diffraction pattern was observed in a polymerized film before heating, and the diffraction pattern of Te or Bi was observed after heating. Measurements by differential scanning calorimetry reveal an exothermic peak at about 80° C. with a $CS_2$ polymerized film containing Te and an exothermic peak at about 200° C. with a $CS_2$ polymerized film containing Bi. These are considered to correspond to the crystalline transformation.

Accordingly, the metal-containing $CS_2$ plasma polymerized film can be made available for laser beam-recording via the thermal processes; the recording beam can be used solely as a localized source of heat, which elevates the temperature of the film to produce localized optical changes in the film due to the sublimation or crystallization of the film.

When a laser beam is irradiated on a film obtained by simple plasma polymerization of an organic monomer instead of $CS_2$ such as styrene or acrylonitrile, the irradiated part does not sublimate. However, when Te particles or Te compound particles are added to this film, increases in absorption coefficient and in refractive index of the film are noticed by the heating effect of the laser beam. X-ray diffraction measurements support the assumption that this is also attributed to crystallization of Te. This crystallization transition is irreversible, and the optical change is extremely large. The Te-containing plasma polymerized film, therefore, can be utilized as laser beam-recording media by taking advantage of the changes in transmissivity and reflectivity resulted from the crystallization of Te. The organic monomer for the plasma polymerized film in the present invention may be, for example, styrene, acrylonitrile, hexamethyldisiloxane, norbornadiene or the like.

The substrate for forming the plasma polymerized film thereon may consist of a conventional material such as glass, a polyester resin, or an acrylic resin.

Figure 3:
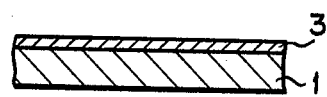
FIGS. 3 to 6 are sectional views illustrating various embodiments of a laser beam-recording medium in accordance with the present invention.
Figure 4:
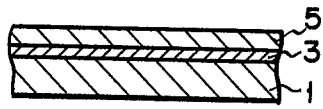
Figure 5:
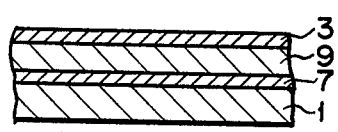
Figure 6:
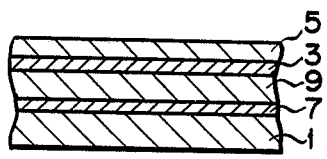

The structure of a laser beam-recording medium in accordance with the present invention may be selected arbitrarily and may take the following forms: a structure as shown in FIG. 3, in which a plasma polymerized film 3 containing fine metal powder is formed on a substrate 1 of, for example, glass; a structure as shown in FIG. 4, in which a protective film 5 of, for example, polyvinyl alcohol is further formed on the plasma polymerized film 3 in the structure shown in FIG. 3; an antireflection structure as shown in FIG. 5 in which a light reflecting film 7 of Al or the like, a transparent film 9 to cause the reflection minimum to occur at the recording wavelength, and the plasma polymerized film 3 containing fine metal powder are formed on the substrate 1 in the order named; and a structure as shown in FIG. 6 in which a protective film 5 is further formed on the plasma polymerized film 3 in the structure of FIG. 5 in a similar manner as in FIG. 4.

The protective film 5 in FIGS. 4 and 6 is formed for preventing the sublimation of the plasma polymerized film 3 and consists of a material such as polyvinylalcohol, polymethylmethacrylate, polyethyleneterephthalate, polyparaxylylene and $SiO_2$. The light reflecting film 7 consists of a material such as Al, Ag. The transparent film 9 is an adjusting layer for reducing the reflected light by effecting interference between the light reflected from the plasma polymerized film 3 and the light reflected from the light reflecting film 7 and cancelling each other. The thickness of this film is selected to be $m\lambda/4n$ (where $\lambda$ is the laser beam wavelength, m is integer and n is the refractive index of the film). The transparent film 9 may comprise an $SiO_2$, $CS_2$ plasma polymerized film, styrene plasma polymerized film, chalcogenide glass such as $As_2S_3$ and so on.

A laser beam-recording medium in accordance with the present invention is advantageous in many respects as described below:

(1) It is easy to control the optical constants such as the absorption coefficient. Therefore, a structure, such as an antireflection structure which facilitates an increase in the absorption efficiency for the laser beam, is easy to adopt. A high absorption coefficient is obtainable in near infrared region where is equivalent to the emission wavelength of a semiconductor laser.

(2) High sensitivity is obtained since the temperature indicating an optical change such as the sublimation temperature or the crystallization temperature is low.

(3) Thermal conductivity is low as compared with a thin metal film.

(4) High resolution is obtained since metals are included in the form of fine particles of 100 Å or less in particle size, and the plasma polymerized film is amorphous and optically homogeneous.

(5) The plasma polymerized film is even and mechanically strong and provides good adhesion with a substrate.

(6) A change in the optical density and refractive index is great when the film is irradiated by a laser beam. The contrast ratio is also high.

An example of the recording method will now be described. The coating of the recording medium is deposited onto the disk substrate. A laser beam, modulated with the information to be recorded, is focused onto a spinning disk to make a recording. The disk speed is 1,800 r.p.m. and the focused beam spot is a diameter of about 1 $\mu$m. The recorded information is retrieved by illuminating the disk with a somewhat less intense beam and then detecting the light reflected back from the disk. For example, a recording medium having an antireflection structure with an Al deposited film, a $CS_2$ plasma polymerized film and a $CS_2$ plasma polymerized film containing Te formed on a glass substrate can provide a recording sensitivity which enables real time recording with a semiconductor laser beam of 20 mW output and 830 nm emission wavelength.

Instead of a laser beam, recording may be performed by sublimation of part of the device heated by an energy beam irradiation such as a flash light beam, an electron beam or by contact with a heater. Therefore, the laser beam recording medium of the present invention is not to be construed as capable of recording only by a laser beam, but it is to be clearly understood that a laser beam is merely an example and the medium of the present invention is capable of recording at least with a laser beam.

Examples of the present invention will now be described.

EXAMPLE 1

An electric discharge was effected by applying a high frequency voltage of 13.56 MHz to an electrode in a chamber into which carbon disulfide gas ($CS_2$) was charged to a pressure of $1\times10^{-2}$ Torr. Using a glass plate as a substrate, discharge was carried out with a $CS_2$ gas flow rate of 100 cc/min, a discharge power of 100 W, and a substrate temperature of 50° C. for 30 minutes to form a thin layer having a thickness of about 1 $\mu$m on the substrate. Elemental analysis revealed that the layer was composed of $CS_4$. A layer formed on a KBr plate under the same polymerization conditions showed infrared absorption spectra attributed to C=S, C—S, and S—S bonds at 1,065 cm$^{-1}$, 810 cm$^{-1}$ and 460 cm$^{-1}$, respectively. This layer sublimated at the temperature of 185° C. with a 10% weight decrease, and its absorption coefficient was $10^4$ cm$^{-1}$ at a wavelength of 750 nm.

Using an He-Ne laser having a wavelength of 633 nm and an output power of 15 mW, this thin layer was measured for recording sensitivity by varying the duration of the laser irradiation. Recording was made by heating and vaporizing the irradiated portions, and the recording energy threshold was shown to be 50 mJ/cm$^2$. This value shows a higher sensitivity than the recording energy threshold of 200 mJ/cm$^2$ obtained when measured under the same conditions with a vacuum-evaporated Te layer formed on a glass plate.

EXAMPLE 2

An electric discharge was effected under the same conditions as in the Example 1. Te was deposited at a deposition rate of 1.5 Å/sec, and a thin film containing about 20 vol.% Te was formed.

The $CS_2$ polymerized film containing Te showed, by differential thermal analysis, an exothermic peak at about 80° C. attributed to the crystallization of amorphous Te, and the absorption coefficient and the refractive index both increased greatly around this temperature. The refractive index was observed to be 2.9 when the film was heated at a temperature of 100° C. for 10 minutes. This is notably different from the refractive index of 2.3 of an unheated polymerized film.

Figure 7:
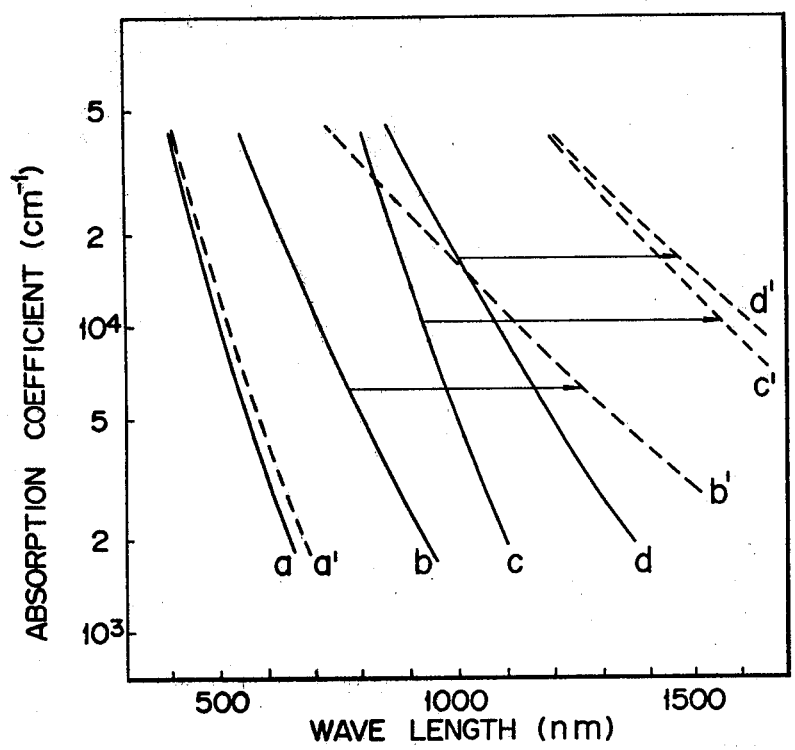
FIG. 7 is a graph showing the relation of the absorption coefficient to the wavelength of a $CS_2$ plasma polymerized film containing Te before and after heating.

By varying the deposition rate of Te, polymerized films containing 10 vol.%, 30 vol.% and 60 vol.% of Te were obtained. The absorption coefficients of these polymerized films as a function of wavelength and the changes after heating at a temperature of 100° C. for 10 minutes were measured. The results are shown in FIG. 7. In the figure, a curve "a" shows the case of a film containing no Te; a curve "b", the case of the film containing 10 vol.% of Te; a curve "c", the case of the film containing 30 vol.% of Te; a curve "d", the case of the film containing 60 vol.% of Te; and curves "a'", "b'", "c'" and "d'", the cases of the respective films after heating at a temperature of 100° C. for 10 minutes.

Te was dispersed as fine particles which were optically homogeneous and almost impossible to observe by an optical microscope. The surface of the obtained thin film was extremely smooth when observed by a scanning electron microscope.

The $CS_2$ plasma polymerized film containing Te, when heated by laser beam irradiation, presented changes in the absorption coefficient and the refractive index and also a tendency toward sublimation. Polyvinyl alcohol was coated to a thickness of 10 $\mu$m on this polymerized film to provide a sublimation preventive structure, and the laser beam recording sensitivity effected by the changes in the absorptive coefficient and the refractive index due to the crystallization were measured. As a laser beam, a GaAs diode laser beam of 15 mW power output and 830 nm wavelength was used. Measurements were performed as the pulse duration of a laser beam was varied, and a recording threshold of 50 mJ/cm$^2$ was obtained.

EXAMPLE 3

In order to improve the laser beam recording sensitivity of the $CS_2$ plasma polymerized film containing Te obtained in Example 2, the recording characteristics obtainable with an antireflection structure as shown in FIG. 3 were observed. With this structure, an Al deposited film (1$\mu$ in thickness), a $CS_2$ plasma polymerized film (0.3$\mu$ in thickness), and a $CS_2$ plasma polymerized film containing 50 vol.% of Te (200 Å in thickness) were formed in the order named so that the light reflected from the $CS_2$ plasma polymerized film containing Te and the light reflected from the Al film interfered and cancelled each other. The $CS_2$ polymerized film containing Te was heat-treated at a temperature of 100° C. in advance to effect crystallization, and the laser beam recording characteristics under sublimation were measured.

The measurements were performed under the same conditions as in Example 2, and a recording energy threshold of 10 mJ/cm$^2$ was obtained.

EXAMPLE 4

An electric discharge was effected under the same conditions as in Example 1, and Bi was deposited at a deposition rate of 2 Å/min so as to form a thin film containing 30 vol.% of Bi on a substrate. The absorption coefficient of this film was measured to be 5$\times$10$^4$ cm$^{-1}$ at a wavelength of 800 m$\mu$. Differential thermal analysis revealed an exothermic peak at 200° C.

The laser beam-recording characteristics of this film under sublimation were measured under the same conditions as in Example 2. A recording energy threshold of 70 mJ/cm$^2$ was obtained.

EXAMPLE 5

An electric discharge was effected under the same conditions as in Example 1, and Ag was deposited at a deposition rate of 1 Å/min so as to form a thin film containing 15 vol.% of Ag on a substrate. The characteristics of the recording medium thus obtained were measured. The absorption coefficient was as high as 6$\times$10$^4$ cm$^{-1}$ at a wavelength of 800 m$\mu$, and the sublimation temperature (the temperature for a 10% decrease in weight) was 250° C.

The laser beam-recording characteristics of this film under sublimation were measured under the same conditions as in Example 2. A recording energy threshold of 200 mJ/cm$^2$ was obtained.

EXAMPLE 6

An electric discharge was effected under the same conditions as in Example 1 and In was deposited at a deposition rate of 2 Å/min so as to form a thin film containing 30 vol.% of In on a substrate. The characteristics of the recording medium thus obtained were measured. The absorption coefficient was as high as 5$\times$10$^4$ cm$^{-1}$ at a wavelength of 800 m$\mu$ and the sublimation temperature (the temperature for a 10% decrease in weight) was 200° C.

The laser beam-recording characteristics of this film under sublimation were measured under the same conditions as in Example 2. A recording energy threshold of 80 mJ/cm$^2$ was obtained.

EXAMPLE 7

An electric discharge was effected under the same conditions as in Example 1, and PbTe was deposited at a deposition rate of 2 Å/min so as to form a thin film containing 30 vol.% of Pb and Te on a substrate. The absorption coefficient of the recording medium thus obtained was measured to be as high as 7$\times$10$^4$ cm$^{-1}$ at a wavelength of 800 m$\mu$. Differential thermal analysis revealed an exothermic peak at 100° C. The absorption coefficient increased with heating as shown in FIG. 7.

EXAMPLE 8

Styrene monomer gas was charged into a chamber to a pressure on the order of 5$\times$10$^{-2}$ Torr. A high frequency voltage of 13.56 MHz was applied to electrodes as Te was deposited from a tungsten board. A glass substrate was used. An electric discharge was effected for 20 minutes with a styrene monomer gas flow rate of 20 cc/min, an electric discharge power of 120 W, and a Te deposition rate of about 2 Å/sec. A styrene plasma polymerized film containing 25 vol.% of Te was formed to a thickness of about 1 $\mu$m on the substrate.

In the infrared absorption spectra of this film, absorption attributed to —C—H and —C=CR was observed at 3,290, 2,200 and 2,100 cm$^{-1}$, and absorption attributed to —CH$_3$ was observed at 2,950, 2,880 and 1,370 cm$^{-1}$.

Differential scanning calorimetry of the styrene polymerized film containing Te revealed an exothermic peak at a temperature of 80°–120° C., and the absorption coefficient and the refractive index increased greatly around this temperature.

Figure 8:
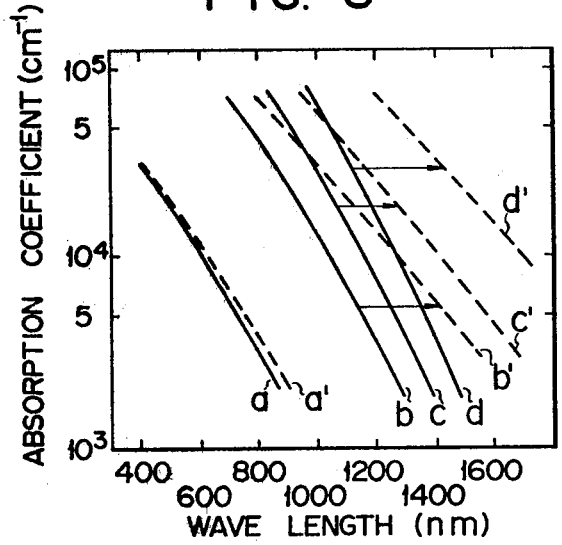
FIG. 8 is a graph showing the relation of the absorption coefficient to the wavelength of a styrene plasma polymerized film containing Te before and after heating.

The absorption coefficients of various plasma polymerized films containing Te obtained by varying the deposition rate of Te, and their changes under heating (120° C. for 10 minutes) are shown in FIG. 8; each exothermic peak temperature is shown in Table 1. In FIG. 8, a curve "a" shows the case of a film containing no Te; a curve "b", a film containing 25 vol.% of Te; a curve "c", a film containing 40 vol.% of Te; a curve "d", a film containing 60 vol.% of Te; and curves "a'", "b'", "c'" and "d'", the respective films after heating.

TABLE 1

| | Exothermic peak temperature of styrene polymerized films containing Te | | |
|---|---|---|---|
| Substrate temperature | Discharge power (W) | Te content (vol. %) | Peak temperature (°C.) |
| Room temperature | 120 | 25 | 116 |
| Room temperature | 200 | 25 | 118 |
| Room temperature | 120 | 40 | 98 |
| Room temperature | 200 | 60 | 85 |
| Room temperature | 200 | 70 | 76 |
| 80° C. | 200 | 70 | 101 |

With a styrene plasma polymerized film containing 25 vol.% of Te, the refractive index was 2.6 when the film was not heated and was 3.2 when the film was heated.

The surface of the polymerized film was observed by a scanning electronic microscope to be extremely smooth before and after heating. X-ray diffraction revealed no diffraction pattern for Te with an unheated polymerized film, and a diffraction pattern for Te with a heated polymerized film.

A styrene polymerized film containing 25 vol.% of Te was formed to a thickness of 1 μm on a glass plate. Under the same conditions as in Example 2, the laser beam-recording sensitivity based on the crystallization was measured. A recording energy threshold of 70 mJ/cm$^2$ was obtained.

EXAMPLE 9

In order to improve the laser recording sensitivity of the styrene plasma polymerized film containing Te of Example 8, the recording characteristics obtainable with an antireflection structure as in FIG. 3 were examined. An Al deposited film (1 μm in thickness), a styrene polymerized film (0.4 μm in thickness), and a styrene polymerized film containing 50 vol.% of Te (200 Å in thickness) were formed in the order named on a glass plate. The laser beam sensitivity was measured under the same conditions as in Example 2. A recording energy threshold of 20 mJ/cm$^2$ was obtained as a result.

EXAMPLE 10

An electric discharge was effected for 30 minutes using acrylonitrile as an organic monomer at a Te deposition rate of 1 Å/sec under the same conditions as in Example 8. An acrylonitrile polymerized film containing 20 vol.% of Te was formed to a thickness of 1 μm. The infrared absorption spectra of this polymerized film revealed absorption based on —C≡N at 2,250 cm$^{-1}$, absorption based on —C=NH at 3,500 cm$^{-1}$, and absorption based on —C=N— at 1,500 cm$^{-1}$.

This film showed an absorption coefficient of $5 \times 10^4$ cm$^{-1}$ at a wavelength of 800 nm. Differential thermal analysis revealed an exothermic peak at 150° C., and the absorption coefficient increased by heating.

EXAMPLE 11

An electric discharge was effected using hexamethyldisiloxane as an organic monomer under the same conditions as in Example 8. After an electric discharge of 15 minutes, a polymerized film of 1 μm in thickness containing 20 vol.% of Te was formed.

The infrared absorption spectra of this film revealed absorption based on C—H at 2,980 cm$^{-1}$, absorption based on Si—CH$_3$ at 1,250 cm$^{-1}$, and absorption based on Si—O— at 1,050 cm$^{-1}$. This polymerized film showed an absorption coefficient of $3 \times 10^4$ cm$^{-1}$ at a wavelength of 800 nm. Differential thermal analysis revealed an exothermic peak at 180° C., and the absorption coefficient increased by heating.

EXAMPLE 12

An electric discharge was effected using norbornadiene as an organic monomer under the same conditions as in Example 9. After an electric discharge of 15 minutes, a polymerized film of 1 μm in thickness containing 20 vol.% of Te was formed.

The infrared absorption spectra of this polymerized film revealed absorption based on C=C at 1,690 cm$^{-1}$ and 980 cm$^{-1}$, and absorption based on C—H at 2,980 cm$^{-1}$. The polymerized film showed an absorption coefficient of $4 \times 10^4$ cm$^{-1}$ at a wavelength of 800 nm and an exothermic peak at 150° C. The absorption coefficient increased by heating.

What we claim is:

1. A laser beam-recording medium comprising a substrate and a plasma polymerized film containing metal particles homogeneously distributed throughout said film formed on said substrate, said plasma polymerized film being highly cross-linked, said metal particles being selected from the group consisting of Te, Bi, Ag, and In and alloys thereof, and said metal particles being in an amount of from 10 to 90 volume %.

2. A recording medium as recited in claim 1 wherein said plasma polymerized film is a plasma polymerized film of carbon disulfide.

3. A recording medium as recited in claim 1 wherein said metal is Te or is formed from a compound containing Te.

4. A recording medium as recited in claim 1 wherein said plasma polymerized film is a plasma polymerized film of organic monomer selected from the group consisting of styrene, acrylonitrile, hexamethyl-disiloxane and norbornadiene.

5. A recording medium as recited in claim 1 wherein said metal is Te.

6. A recording medium as recited in any one of claims 1, 2, 3, 4 or 5 wherein said metal consists of particles of less than 100 Å.

7. A recording medium as recited in any one of claims 1, 2, 3, 4 or 5 wherein said substrate is made of glass or an acrylic resin.

8. A recording medium as recited in any one of claims 1, 2, 3, 4 or 5 wherein said substrate has on its upper surface, a light reflection film, a transparent layer to cause the reflection minimum to occur at the recording wavelength and said plasma polymerized film containing a metal is formed on the upper surface of said transparent layer.

9. A recording medium as recited in claim 8 wherein a protective film is coated over said plasma polymerized film.

10. A recording medium as recited in any one of claims 1, 2, 3, 4 or 5 wherein a protective film is coated over said plasma polymerized film.

* * * * *